United States Patent
Talwar et al.

(10) Patent No.: US 6,297,135 B1
(45) Date of Patent: Oct. 2, 2001

(54) METHOD FOR FORMING SILICIDE REGIONS ON AN INTEGRATED DEVICE

(75) Inventors: Somit Talwar; Gaurav Verma, both of Palo Alto, CA (US); Karl-Josef Kramer, Vaihingen (DE); Kurt Weiner, San Jose, CA (US)

(73) Assignee: Ultratech Stepper, Inc., San Jose, CA (US)

( * ) Notice: Subject to any disclaimer, the term of this patent is extended or adjusted under 35 U.S.C. 154(b) by 0 days.

(21) Appl. No.: 09/158,265

(22) Filed: Sep. 21, 1998

Related U.S. Application Data

(63) Continuation-in-part of application No. 08/791,775, filed on Jan. 29, 1997.

(51) Int. Cl.[7] .............................. H01L 21/22; H01L 21/24
(52) U.S. Cl. ..................... 438/592; 438/533; 438/586; 438/655; 438/657; 438/659; 438/661
(58) Field of Search .................................. 438/533, 657, 438/661, 662, 586, 592, 665, 655

(56) References Cited

U.S. PATENT DOCUMENTS

| | | | |
|---|---|---|---|
| 4,439,245 | 3/1984 | Wu | 148/1.5 |
| 5,145,808 | 9/1992 | Sameshima et al. | 437/173 |
| 5,162,239 | 11/1992 | Winer et al. | 437/4 |
| 5,366,926 | 11/1994 | Mei et al. | 437/173 |
| 5,399,506 | 3/1995 | Tsukamoto | 437/19 |
| 5,401,666 | 3/1995 | Tsukamoto | 437/41 |
| 5,474,940 | 12/1995 | Tsukamoto | 21/26 |
| 5,565,377 | 10/1996 | Weiner et al. | 21/26 |
| 5,612,235 | 3/1997 | Wu et al. | 437/41 |

*Primary Examiner*—David Nelms
*Assistant Examiner*—Reneé R. Berry
(74) *Attorney, Agent, or Firm*—Allston L. Jones

(57) ABSTRACT

The invented method can be used to form silicide contacts to an integrated MISFET device. Field isolation layers are formed to electrically isolate a portion of the silicon substrate, and gate, source and drain regions are formed therein. A polysilicon runner(s) that makes an electrical connection to the integrated device, is formed on the isolation layers. The structure is subjected to ion implantation to amorphized portions of the silicon gate, source, drain and runner regions. A metal layer is formed in contact with the amorphized regions, and the metal layer overlying the active region of the integrated device is selectively irradiated using a mask. The light melts part of the gate, and amorphized source and drain regions while the remaining portions of the integrated device and substrate remain in their solid phases. Metal diffuses into the melted gate, source and drain regions which are thus converted into respective silicide alloy regions. Preferably, during selective irradiation, a portion of the gate region is not exposed to light so that it is relatively cool and acts as a heat sink to draw heat away from the irradiated portion of the gate region. The heat sink effect causes the gate silicidation rate to more closely correspond with the relatively slow source and drain silicidation rates. The method further includes a blanket irradiation step to diffuse metal into the runner regions to form silicide alloy regions which are then treated to form silicide regions.

50 Claims, 5 Drawing Sheets

METHOD FOR FORMING SILICIDE REGIONS ON AN INTEGRATED DEVICE

CROSS-REFERENCE TO RELATED APPLICATIONS

This patent application is a continuation-in-part of application Ser. No. 08/791,775 filed Jan. 29, 1997, in which the named inventors and assignee entity are the same.

GOVERNMENT RIGHT

This invention was made with Government support under contract number N66001-95-C-8002 awarded by the Space and Naval Warfare Systems Command, San Diego. The Government has certain rights in the invention.

BACKGROUND OF THE INVENTION

1. Field of the Invention

This invention is directed to a method for forming silicide regions for low-resistance electrical connections to integrated devices formed on silicon substrates. The reduced contact resistances provide the devices with the capability to operate at relatively high speeds.

2. Description of the Related Art

Many techniques have been developed for forming silicide regions for integrated device contacts, particularly for metal-oxide-semiconductor (MOS) devices formed on silicon substrates. Most of these techniques involve the formation of a metal layer over gate, drain or source regions upon which the silicide is desired to be formed. These techniques then use thermal treatment for extended periods of time to react the metal with the silicon composing the gate, drain and/or source regions, to form the low-resistivity silicide regions. The substrate is further processed by removing the unreacted metal layer.

Techniques for forming silicides are subject to several stringent process constraints that must be met in order for such techniques to be effective. These constraints include: (1) the metal used to form the silicide and the temperature at which the silicide is formed must be carefully selected so that the metal diffuses into the silicon, to avoid the formation of leakage paths between the source, drain and gate of an integrated device; (2) for self-aligned silicidation techniques, the metal layer must not react with the insulating material composing the side walls of the gate; (3) the dopants must not segregate appreciably into the silicide regions so that low contact resistance can be achieved; (4) the technique should have a process window that allows the silicide region to be formed on both c-silicon and poly-silicon; (5) the silicide formation should be insensitive to dopants present in the silicon; and (6) the metal atoms should not diffuse beyond the silicide regions to prevent increase in junction leakage. The simultaneous achievement of all of the above-stated criteria is at best difficult for most conventional silicidation techniques, especially those that use relatively extensive thermal treatments. Most often, a failure to perform the conventional technique within its relatively narrow process margins manifests itself in the occurrence of defects due to thermal drift of the metal atoms beyond desired boundaries during the relatively prolonged thermal treatment periods required by such techniques. If the silicide region extends beyond its design dimensions, it can cause leakage paths between the gate, source/drain and the substrate. There is therefore a great need for a technique that enhances silicidation process margins beyond those conventionally available.

In addition to conventional techniques that use prolonged thermal treatments, some conventional silicidation techniques use ion implantation to achieve formation of the silicide regions. These ion-implantation silicidation techniques use either ion beam mixing of different ion types to produce a silicide of a desired composition, or implantation of a desired species of metal ions in a proportion needed to achieve proper stoichiometry. In either of these two types of techniques, the ion-implantation is so extensive as to be extremely time-consuming, especially if a stoichiometric proportion of ions needed to make the silicide must be implanted into the silicon substrate. In addition, extensive ion implantation will eventually lead to 'knock-on', a phenomenon in which moving ions strike ions previously implanted, driving them further than desired into the silicon substrate. The occurrence of knock-on leads to increased junction leakage. Thus, there is a significant need for a technique that can overcome the above-noted disadvantages of conventional silicidation techniques.

A constraint of the silicidation techniques discussed above is that the silicide thickness over the gate and the polysilicon runners is the same as that over the source/drain regions. As source/drain junctions are scaled to shallower depths, the silicide thickness over the source/drain also needs to be lowered to prevent leakage. However, silicide thickness scaling is not necessary over the gate region and it is in fact advantageous to have thicker silicide over the gate than the source/drain. Such a silicide can be formed either by depositing a thicker metal layer over the gate than the source/drain, or by subjecting the gate to a higher thermal budget. Neither of these two options are feasible using conventional silicide formation techniques.

SUMMARY

This invention overcomes the above-noted disadvantages. A preferred embodiment of the invented method includes a step of producing amorphous regions on the gate, source, drain and runner(s) of an integrated device formed on a silicon substrate. The method also includes a step of forming a metal layer in contact with the amorphous regions, and a step of selectively irradiating the metal layer with light to diffuse metal into the gate, and amorphous source and drain regions to form respective alloy regions of silicide composition. The method further includes a step of blanket irradiating the metal layer with light to diffuse metal into the runners to form an alloy region therein. Through two-step irradiation, high-quality suicides can be produced on the gate, source, drain and runner regions despite the typically large differences in laser fluence required to form silicide over the gate, source and drain relative to the runner(s).

In general, silicidation proceeds more rapidly in the gate region as compared to the source and drain regions because the gate region is more thermally insulated as compared to the source and drain regions which are integral with the substrate that acts as a heat sink. With the invented method, however, the fluence required for silicidation in the gate is raised if the gate region extends beyond, and/or is coupled to a runner situated outside of, the selectively irradiated area. The portion of the gate region and/or coupled runner that is not irradiated is relatively cool and thus acts as a heat sink to draw heat away from the gate region. Accordingly, the fluence required for silicidation of the gate can be raised to more closely correspond to the fluence required for silicidation in the source and drain. By forcing the respective fluences for silicidation required in the gate, source and drain closer to one another in the invented method, relatively high-quality silicides can be formed together in the gate, source, and drain of the integrated device.

Preferably, the light fluence used in the selective radiation step is determined so that sufficient energy is absorbed by the metal layer to melt the amorphous regions of the source/drain and part of the gate region until the metal layer overlying the gate region is consumed, at which point the increased reflectivity of the gate alloy (especially in its liquid state) is sufficient to prevent further melting of the gate alloy region. By preventing further significant melting beyond the alloy region, the silicide in the gate region is relatively stoichiometric and has a low sheet resistance. Also, if desired, the selective irradiation step can be continued to allow further growth of the silicide regions in the source and drain without adversely impacting the gate region due to its increased reflectivity upon exposure of the alloy region resulting from consumption of the overlying metal.

Similarly, the blanket irradiation step can be performed at least until the metal layer overlying the runner is consumed. The fluence of the blanket irradiation step is preferably selected so that, upon consumption of the metal layer overlying the runner, the exposed silicide alloy region, especially in its liquid state, reflects sufficiently more light as compared to the metal layer to prevent further melting of the runner region. Because the runner is generally located on a field isolation layer that has relatively poor thermal conductivity, the silicide growth rate in the runner region is relatively rapid as compared to those of the gate, source and drain regions. Therefore, the fluence of the light used to perform blanket irradiation is determined to be sufficiently low to prevent any significant adverse impact to the gate, source or drain regions. On the other hand, the fluence of the light used to perform blanket irradiation is also sufficiently high to form a high-quality silicide region on the runner.

The step of producing the amorphous region in the silicon body is preferably performed through ion implantation. The depth to which the amorphous region is formed in the silicon body is determined and controlled with high accuracy by selection of the atomic weight of the ion species used for implantation, the implantation energy, and the dosage of ions implanted in the silicon body. Knock-on of metal is not an issue because the amorphization implant is performed prior to metal deposition. The step of forming or positioning the metal layer on the amorphous region is preferably performed by sputtering, evaporating or depositing the metal onto the silicon body. The metal can be one of a large variety of metals, including titanium, cobalt and nickel. The step of irradiating the metal layer is preferably accomplished with pulsed laser light with a power sufficient to render part of the gate and the amorphous region in the source/drain molten while the metal layer, the silicon substrate and other components of the integrated device and its runner(s) remain in their solid states. Metal diffuses into the molten regions so that such regions become alloy regions with silicide composition. To melt part of the gate and the amorphous source/drain regions while not melting the metal layer, the silicon substrate, or other integrated device components, the fluence of the laser light used to irradiate the metal layer is preferably in a range from 0.1 to 1.0 Joules per square centimeter. The invented method can also include a step of treating the alloy region to convert it into a silicide region with a lower resistivity structure. Preferably, the treating step is performed by rapid thermal annealing.

The invented method provides several advantages over conventional silicidation techniques. The silicide depth in the invented method can be precisely controlled in the source and drain region by controlling the depth of the amorphous region. Thickness of the silicide on the gate and the runners can be independently controlled by the thickness of the deposited metal layer. In the invented method, metal is always the diffusing species which prevents the formation of leakage paths and avoids other problems that would adversely impact the electronic characteristics of the integrated device. Localized surface heating helps to reduce the thermal budget and its resulting impact on the integrated device. Upon consumption of the metal layer overlying the gate or runner regions in a preferred embodiment of the invented method, the reflectivity of the gate or runner region (especially in the molten state) increases and thus reduces thermal loading of such regions. Irradiation of the metal layer overlying the source and drain regions can thus continue without adversely impacting the gate regions so that relatively low-resistance silicides can be formed in the source and drain regions as well as in the gate regions. With the reduced gate, source, drain and runner silicide resistivities made possible with the invented method, the resulting transistor device is capable of relatively high-speed operation. Another advantage of the invented method is that it provides independent control of silicide thickness over the source and drain, and gate and runner regions. Hence, lower resistance is possible over the gate and runners for a given silicide thickness over the source and drain, a feature made possible because the method allows for the formation of thicker silicides over the gate and runner as compared to the source and drain.

These together with other features and advantages, which will become subsequently apparent, reside in the details of construction and operation of the invention as more fully hereinafter described and claimed, reference being made to the accompanying drawings, forming a part hereof wherein like numerals refer to like parts throughout the several views.

DESCRIPTION OF THE PREFERRED EMBODIMENTS

Figure 1A:
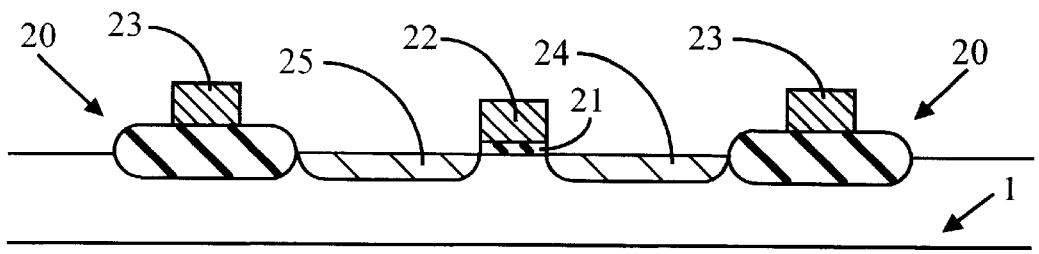
FIGS. 1A through 1L are cross-sectional diagrams of a silicon substrate showing steps of the invented method as applied to self-aligned silicidation of the contacts for the gate, drain and source of an integrated MISFET device.

FIGS. 1A through 1L are cross-sectional diagrams of the invented method as applied to self-aligned silicidation of the contact regions for the gate, source, drain, and connection runners of an integrated MISFET device formed on a silicon substrate 1. Although the silicon substrate disclosed herein is a silicon wafer, the invented method can be readily applied to other types of substrates such as a silicon-on-insulator (SOI) substrate, a silicon epitaxial layer, or a layer of c-silicon or polysilicon. In FIG. 1A, using techniques and materials that are well-known, field insulator layers 20 (preferably composed of silicon-oxide, for example) are formed to electrically isolate an area of the silicon body in which the MISFET device is to be formed. A gate insulator layer 21 is formed on the surface of the silicon substrate 1. The gate insulator layer 21 can be a silicon oxide layer, for example, in which case the resulting device is a MOSFET. Poly-silicon or amorphous silicon layers 22, 23 are then deposited by low pressure chemical vapor deposition, for example, on the gate insulator layer 21 and the field insulator layers 20, respectively. The silicon layer and gate insulator layer are patterned using at least one resist layer, to selectively form or etch the silicon layer and the gate insulator layer to form the silicon gate region 22, the runners 23, and the gate insulator layer 21, as shown in FIG. 1A. Suitable resists and etching techniques are well-known to persons of average skill in this technology. Drain and source regions 24, 25 are then doped with appropriate n-type or p-type dopants. If the silicon body 1 is n-type, the drain and source regions are doped with p-type dopants. On the other hand, if the silicon body 1 is n-type, the drain and source regions are doped with p-type dopants.

Figure 1B:
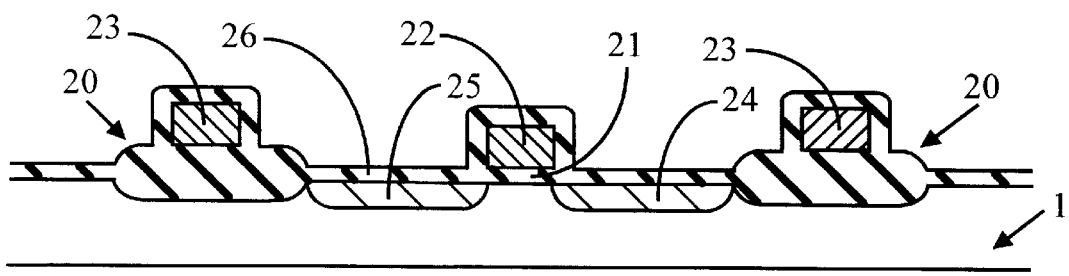
Figure 1C:
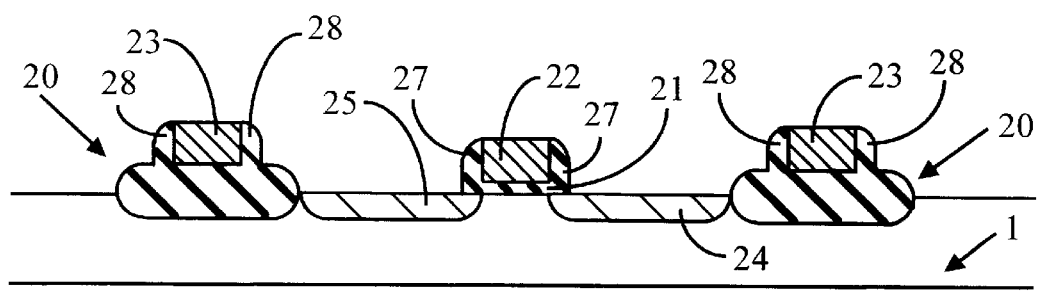

In FIG. 1B, an insulator layer 26 is formed over the silicon body 1, the silicon gate region 22 and the runners 23. The insulator layer can be composed of silicon oxide, for example. The insulator layer 26 is then selectively etched to form insulator side walls 27, 28 on the sides of the silicon gate region 22 and the runners 23, respectively, as shown in FIG. 1C. The side walls 27, 28 help to achieve self-alignment of the position of the silicide regions yet to be formed.

Figure 1D:
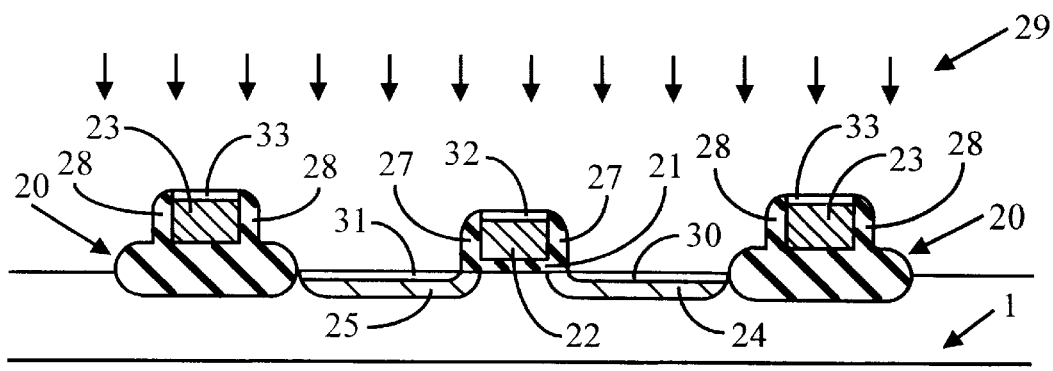

In FIG. 1D, ions 29 are implanted to form the amorphous regions 30, 31, 32, 33 over the source, drain, gate and runner regions, respectively. The implanted ions destroy the chemical bonds between silicon atoms in localized areas of the source and drain portions of the substrate, and the gate and runners so that the atomic structure is made relatively disordered and random compared with the portions of the silicon substrate that are not affected by ion bombardment. The melting temperature of the amorphous regions is considerably lower than that for crystalline silicon, a feature which is used to advantage in the invented method. Preferably, the ion species, the implantation energy and the dosage are selected to produce the amorphized regions to a predetermined depth to which silicidation is desired in the source/drain regions. In general, selecting an ion species with a relatively light atomic weight, increasing the ion implantation energy, or increasing the ion dosage, will each have the effect of increasing the depth to which the amorphous regions extend. Conversely, selecting an ion species with relatively heavy atomic weight, decreasing the ion implantation energy, or decreasing the ion dosage, will each have the effect of decreasing the depth to which the amorphous regions extend. A number of ion species can be used to produce the amorphous regions. For example, the ion species can include silicon, argon, arsenic, or germanium. The ion implantation energy can be in a range from 2 to 100 kilo-electronVolts (keV) at a dosage in a range from $10^{13}$ to $10^{15}$ ions per square centimeter. In the preferred embodiment, the depth to which the amorphized regions extend into the source and drain regions of the silicon substrate, and the gate region and runners, is predetermined to be about 400 Å. To produce the amorphized region to a depth of 400 Å, the inventors have determined that arsenic ions implanted at an energy of about 30 keV with a dosage of about $3\times10^{14}$ atoms per square centimeter will achieve amorphization of the silicon body to this depth. The ion implantation can be performed with a device such as the 9500 XR Ion Implanter commercially available from Applied Materials, Inc. of San Jose, Calif.

If the silicon substrate is removed from the vacuum chamber in which ion implantation is performed, the substrate may be exposed to the atmosphere and thus to a degree of oxidation due to the atmosphere's oxygen content. The oxidation forms a so-called 'native' oxide layer over the surface of the silicon substrate. So that such native oxide layer will not adversely affect subsequent processing in accordance with the methods of this invention, the native oxide layer can be stripped with an acidic solution. For example, a solution of 1:100 ratio of HF to $H_2O$ strips oxide at a rate of 20 Å per minute. A sixty second treatment of the substrate with the acidic solution is sufficient to remove the native oxide layer. In the alternative, the invented method can be practiced in an air-tight chamber so that the amorphous region is not exposed to an oxidizing environment before the formation of the metal layer thereon, thus altogether avoiding the formation of an oxide layer that would require removal.

Figure 1E:
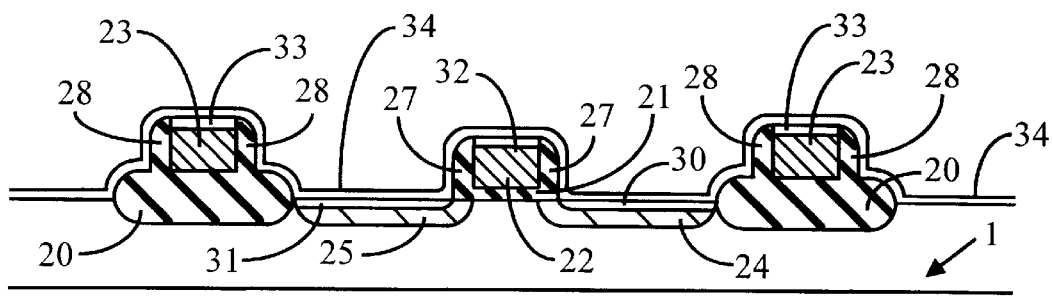

In FIG. 1E, a metal layer 34 is formed over the surface of the amorphous regions 30, 31, 32, 33. The metal layer supplies the metal atoms needed to form the desired silicide compound for electrical contact with the integrated device and its connection runners. With the invented method, a number of metal species can be used to form the silicide compound. For example, the metal layer can include titanium, cobalt or nickel used to form the silicides $TiSi_2$, $CoSi_2$, or $NiSi$ with resistivities of 15–20 $\mu\Omega\cdot cm$, 17–20 $\mu\Omega\cdot cm$, and 12–15 $\mu\Omega\cdot cm$, respectively. The metal layer is formed preferably by sputtering, but evaporation or chemical vapor deposition can also be used. For example, to form the metal layer, a suitable sputtering chamber is the Endura VHPPVD commercially available from Applied Materials, Inc. of San Jose, Calif. Preferably, the metal layer is formed in a thickness that is determined based upon the desired silicide thickness or depth and the stoichiometric proportion of silicon and metal consumed to form the silicide. More specifically, the metal layer's thickness should be at least the amorphized silicon depth divided by the ratio of silicon to metal consumed to form stoichiometric silicide. Thus, to react titanium with 400 Å of amorphous silicon to form approximately 440 Å of silicide, due to the atomic structure of this silicide, 2.27 Å thickness of silicon is consumed per 1 Å of titanium (i.e., a consumption ratio of 2.27), the thickness of the metal layer should be about 400 Å/2.27$\widetilde{=}$175 Å to ensure that a stoichiometric silicide of desired depth can be formed.

Figure 1F:
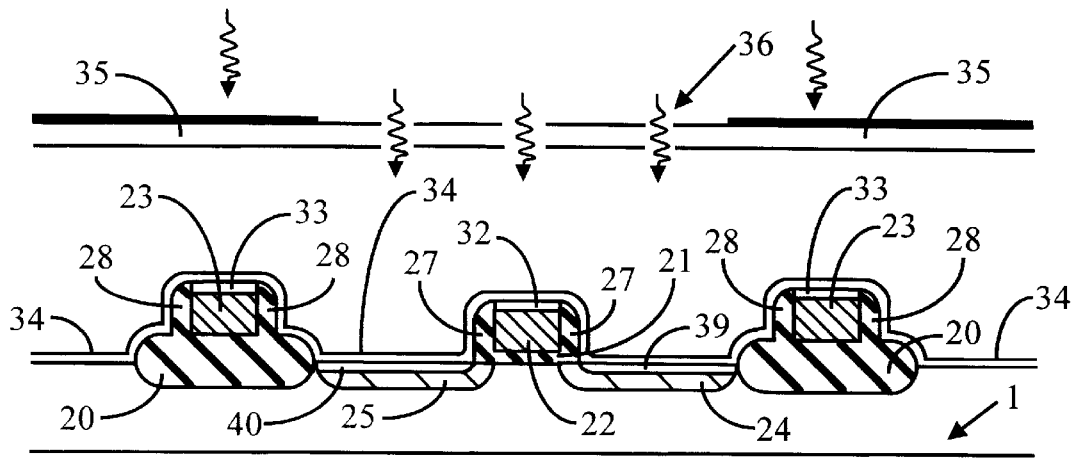

In FIG. 1F, a mask 35 is positioned over the substrate. The mask 35 is patterned so that it has regions that are substantially light-transmissive overlying the active area of the substrate which includes the gate, drain and source, but that has substantially non-transmissive regions overlying the isolation layers 20. The mask 35 can be patterned by selectively etching a dielectric-stack-on-glass blank as is well-known in this technology. The blank is etched to remove the dielectric stack from light-transmissive regions that are to be positioned over the active areas of the substrate. The mask 35 can be positioned over the active region of the substrate using conventional lithography alignment equipment and techniques. The metal layer is irradiated with light designated numeral '36' to diffuse metal from the layer 34 into regions 30, 31, 32, 33. Preferably, the light is generated by a laser with a fluence sufficient to render the amorphous regions and part of the gate regions molten, and yet with insufficient power to melt the silicon substrate 1, the gate insulator layer 21, the side walls 27, 28, the field insulator regions 20 or the metal layer 34. It has been determined that α-silicon melts at 200–600° C. lower than crystalline silicon, so that the temperature window for selective melting of the amorphous regions is relatively large. Due to the relatively high diffusivity of the metal in liquid silicon, the molten amorphous regions become respective alloy regions of silicide composition. In general, it has been determined that the laser light must be applied over several pulses to ensure complete mixing of the metal in the silicon. Between laser pulses, the substrate is allowed to cool to room temperature. To ensure that the irradiation step is performed within the process margin of the invented method in which the amorphous regions and part of the gate regions are rendered molten and the silicon substrate 1, the gate insulator layer 21, the side walls 27, 28, the field insulator regions 20 and the metal layer 34 remain in their solid phases, the laser light should have a fluence in a range from 0.1 to 1.0 Joules per square centimeter delivered in a series of 3 to 10 shots of 10 to 100 nanoseconds in pulsewidth at a repetition rate of from 1 to 1000 Hertz to form silicide to a depth of about 1000 Å in the gate regions and 400 Å in the source/drain regions. The exact laser fluence, number of shots, shot duration and repetition rate that will be needed to operate within the process margin for the invented method will vary between different kinds of laser devices and the desired silicide thickness. For the Model No. 4308 laser commercially available from Lambda Physik, Inc. of Fort Lauderdale, Fla., the preferred fluence is 0.3–0.5 Joules per square centimeter, delivered in 10 shots of 20 nanosecond pulsewidth at a repetition rate of 300 Hertz. The irradiation of the metal layer 34 is preferably performed in a chamber with an inert atmosphere of nitrogen, argon or helium. A suitable chamber is the P-GILA machine commercially available from Ultratech Stepper, Inc. The inventors have determined that, with proper delivery of the laser light in accordance with the above-described guidelines and principles, the temperature window over which the amorphous regions and part of the gate regions are molten while the other regions of the structure shown in FIG. 1F remain in their solid phases, occurs over a relatively large range from 1150° to 1410° Celsius, and thus over a range of about 260° Celsius. Thus, the invented methods greatly enhance the process margin available for successful performance of the invented method relative to conventional silicidation techniques. Importantly, the process margin is further enhanced by an additional feature of the invented method. In general, silicide in the gate region tends to form at lower fluences compared to the silicides in the source and drain. This phenomenon occurs because the gate region is thermally insulated by the insulator layer 21 and the side walls 27 whereas the source and drain regions 30, 31 are integral with the substrate which acts as a heat sink for thermal energy generated by irradiation with the light 36. In the invented method, by selectively irradiating only the active gate, source and drain areas, the gate region 22 extending outside of the active area onto the field isolation layers 20 is not subjected to significant heating. The relatively cool portions of the gate region 22 sink heat away from the irradiated portion of the gate region, and thus lower its silicide growth rate to more closely correspond to the silicide grow rates of the source and drain. Thus, because the gate, source and drain silicide growth rates are closer together, due to the selective irradiation of the active area of the substrate, relatively stoichiometric silicides can be grown together on the gate, source and drain of the integrated MISFET device. As metal diffuses into the regions 30, 31, 32 due to the heating action induced by the light 36, the regions 30, 31, 32 become respective alloy regions 37, 39, 40, as shown in FIG. 1G.

Figure 1G:
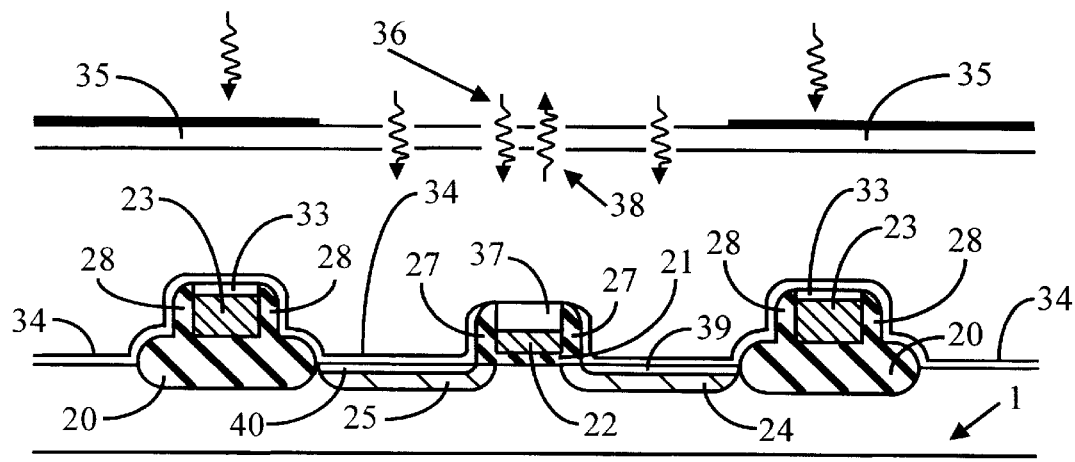

In FIG. 1G, irradiation of the light 36 onto the amorphous regions 30, 31, 32 preferably continues until the metal layer overlying the gate silicon body 22 is completely consumed and the resulting gate alloy region 37 is exposed. At this point, the gate alloy region 37, especially any molten portion thereof, is more reflective than the metal layer 34, and so reflects an increased amount of light denoted as '38' in FIG. 1F. With proper selection of the fluence of the light 36, the increased reflection of the light 38 from the exposed gate alloy region 37 can be such that it prevents absorption of enough light energy to arrest or at least significantly inhibit further migration of the metal atoms in the gate region beyond the alloy region existing upon complete consumption of the overlying metal. Further irradiation of the active area of the substrate in FIG. 1G will thus allow silicide growth to continue in the typically slow-growth source and drain regions 24, 25 without causing further migration of metal atoms through melting in the gate region 22. This feature allows for relatively stoichiometric (and thus low-resistivity), highly-defined silicides to be grown on the gate, source and drain of the MISFET device. The operational speed attainable with the low-resistivity contacts of the MISFET device is thus relatively high. After irradiation with the light 36, the alloy regions cool to a chemical form that is at least partially crystalline.

Figure 1H:
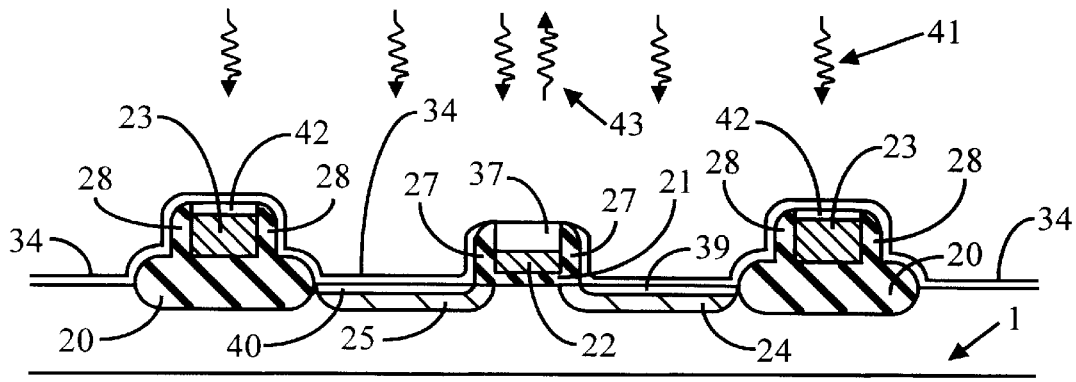

In FIG. 1H, the mask 35 is removed from its position overlying the substrate 1, and the metal layer is blanket irradiated with light 41. The light 41 preferably has a lower fluence than that of the light 36 used in the irradiation steps of FIGS. 1F and 1G. Due to the positioning of the runners 23 on the isolation layers 20 which are relatively poor thermal conductors, the silicide growth rate in the alloy regions 42 is significantly higher than for the active alloy regions 39, 40. The fluence of the light 41 is preferably selected so that it has no significant impact on the silicide alloy regions 37, and yet is sufficient to cause metal atoms to diffuse from the layer 34 into the alloy regions 39, 40, 42 and portions of the gate region 32 positioned on the field isolation layers 20 (not shown in FIGS. 1A–1L, but shown in FIG. 2). Thus, the light 41 promotes silicide growth in the alloy regions 39, 40, 42, while the reflectivity of the alloy region 37 is sufficiently high (especially in its molten state) to reflect enough light 43 to prevent any further melting of the silicon region 22 underlying the alloy region 37. In general, the desired light fluence is in a range from 0.1 to 1.0 Joules per square centimeter delivered in a series of 3 to 10 shots of 10 to 100 nanoseconds in pulsewidth at a repetition rate of from 1 to 1000 Hertz to produce silicide to a depth of about 1000 Å in the regions 42. The exact laser fluence, number of shots, shot duration and repetition rate that will be needed to operate within the process margin for the invented method will vary between different kinds of laser devices and the desired silicide thickness. For the Model No. 4308 laser commercially available from Lambda Physik, Inc. of Fort Lauderdale, Fla., the preferred fluence for blanket irradiation is in a range from 0.1 to 0.35 Joules per square centimeter, delivered in 10 shots of 30 nanosecond pulsewidth at a repetition rate of 300 Hertz. As metal atoms diffuse into the regions 33 due to heating produced by blanket irradiation, the regions 33 become alloy regions 42.

Figure 1I:
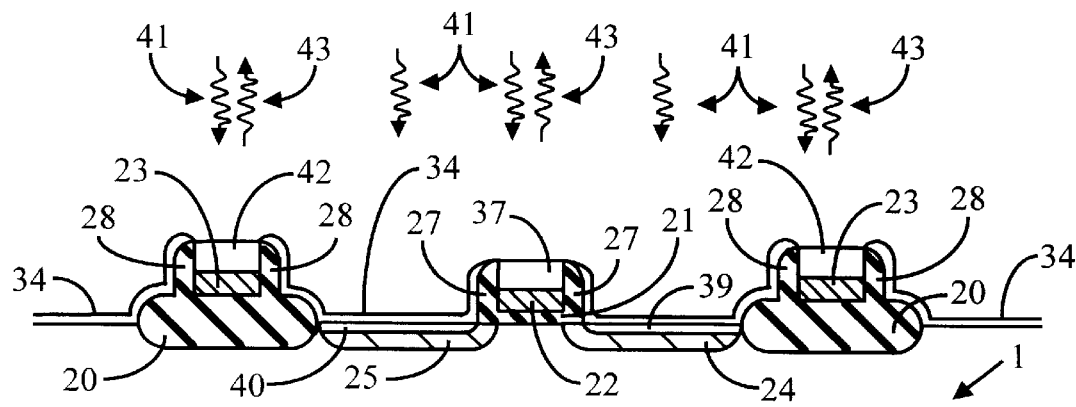

In FIG. 1I, irradiation of the regions 23 on the isolation layers 20 continues until the overlying metal layer 34 is completely consumed to expose the alloy regions. The fluence of the light 41 is such that it has enough energy to melt the regions 42 situated on the isolation layers 20 if the metal layer 34 is unconsumed over these regions, but has an insufficient amount of energy to melt the regions 23 if the overlying metal layer is consumed due to the higher reflectivity of the alloy regions relative to the metal layer 34. The increased reflectivity upon consumption of the overlying metal layer and exposure of the regions 42 prevents further melting of the regions 23, thus arresting further significant migration of the metal atoms through melting beyond the desired contours of the silicide regions. Upon cooling after light irradiation, regions 42 become alloy regions with a partially-crystallized state in which the atoms of the silicide are relatively ordered, yet not entirely so.

Figure 1J:
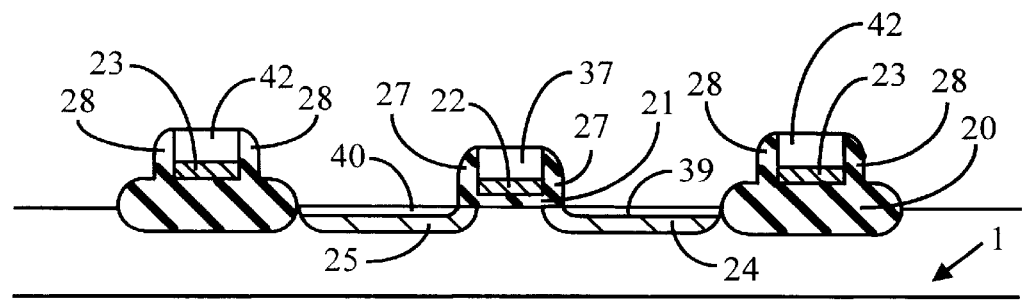

After performance of the irradiation step in FIG. 1I, the unconsumed portion of the metal layer 34 is stripped from the silicon substrate. The stripping of the metal layer can be performed with a 4:1 solution of sulfuric acid ($H_2SO_4$) and hydrogen peroxide ($H_2O_2$) heated to 180° Celsius. Typically, immersion of the silicon body for about ten minutes is sufficient to remove the metal layer, although the time and chemical substance necessary to strip the metal layer can vary to a degree depending upon the type of metal and its thickness. Immersion can be performed in a spray etch tool like the Equinox™ made by SEMITOOL™ of Kalispell, Montana. FIG. 1J shows the substrate after stripping of the unconsumed portion of the metal layer 34.

Figure 1K:
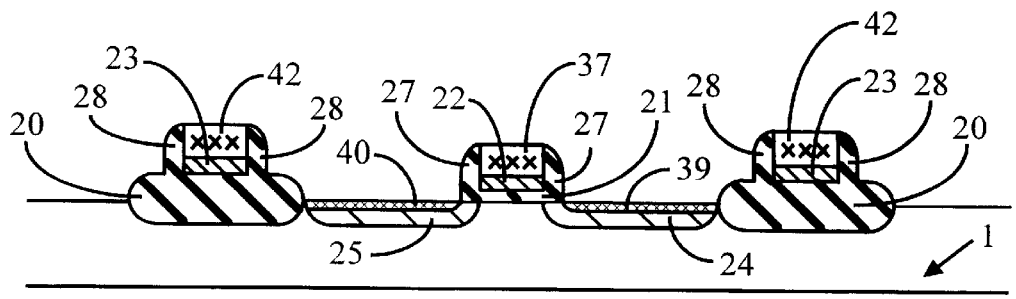

In FIG. 1K, the alloy regions 37, 39, 40, 42 can be subjected to treatment to change the crystal structure of the alloy regions into form which have desired low-resistivity characteristics. The silicide regions 37, 39, 40, 42 are indicated by 'x' hatching in FIG. 1K. Preferably, the treatment of the alloy regions to form respective low-resistance silicide regions is performed with rapid thermal annealing. The rapid thermal annealing can be performed by subjecting the silicon body to a temperature of 500°–900° Celsius for a time duration ranging from 1 hour down to 10 seconds. Preferably, for $TiSi_2$ silicide, the silicon body is subjected to rapid thermal annealing at a temperature of 850° Celsius for 20 seconds to convert the alloy region into the desired silicide. The atmosphere in which the silicon body is placed during rapid thermal annealing should be inert. Accordingly, for example, the rapid thermal annealing should be performed in a chamber containing a nitrogen atmosphere. The rapid thermal annealing can be performed in a Rapid Thermal Processing tool designated Centura that is commercially available from Applied Materials, Inc. of San Jose, Calif.

Figure 1L:
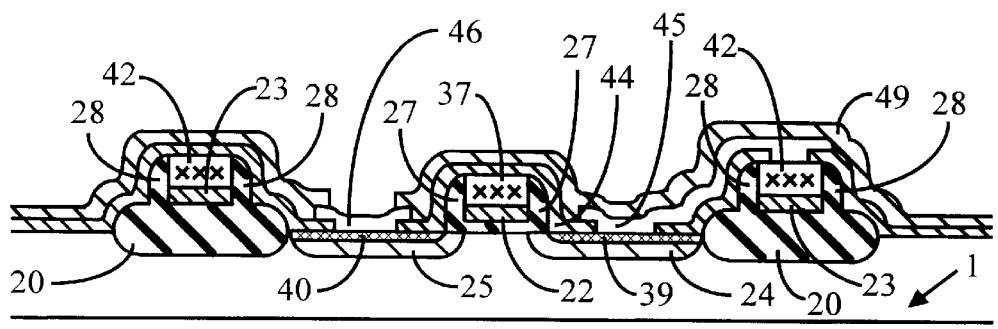
Figure 2:
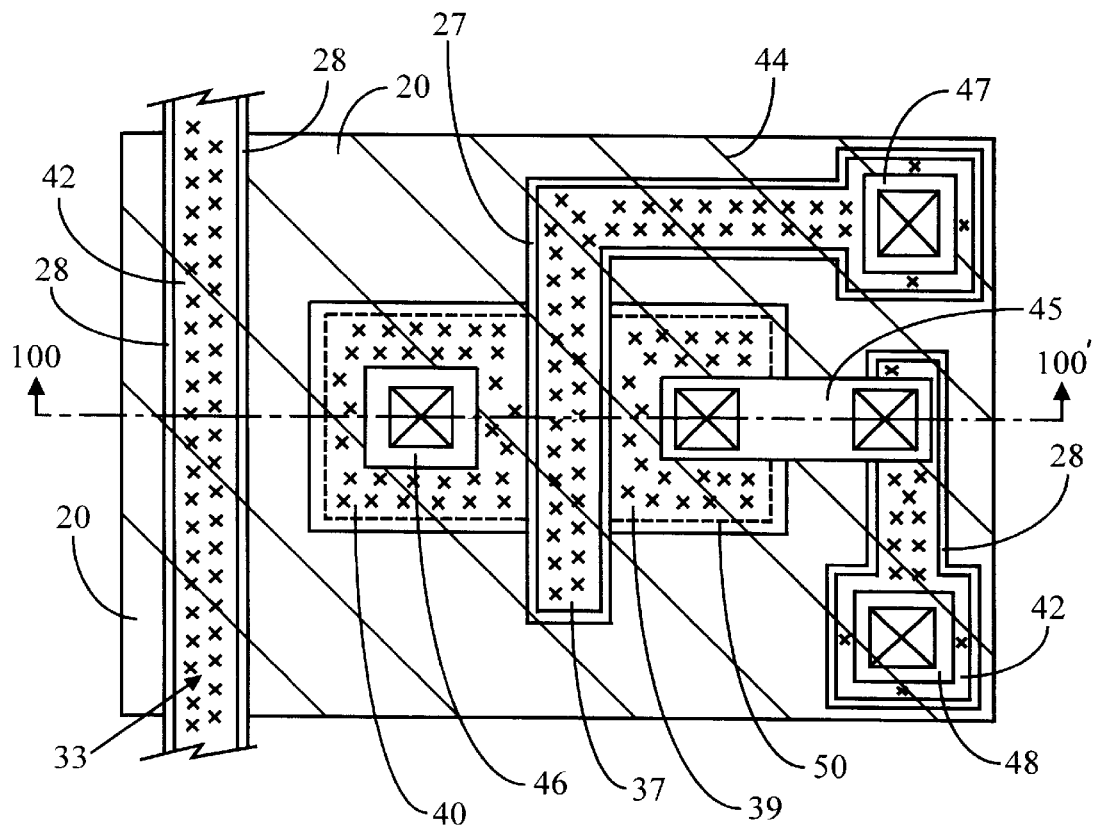
FIG. 2 is a top plan view of the MISFET device.

FIG. 1L is an exemplary diagram illustrating how the terminals of the integrated device or runners might be connected to other components of an integrated circuit. Of course, persons of ordinary skill in the art will readily understand that numerous variations other than the particular configuration shown in FIG. 1L are possible, and that a particular integrated circuit implementation generally depends upon the specific circuit desired to be formed. In FIG. 1L, an insulator layer 44 composed of silicon-oxide, for example, is formed on the field insulator regions 20, the silicide regions 37, 39, 40, 42, and the side walls 27, 28. The insulator layer 44 is selectively patterned to expose portions of the silicide regions 37, 39, 40, 42 (the exposed portion of the region 32 is not shown in FIG. 1L, but is shown in FIG. 2). Conductive leads or contacts 45, 46, 47, 48 (only lead 45 and contact 46 are shown in FIG. 1L) composed of aluminum or other conductive metal, are formed and patterned so as to make electrical contact with the silicide regions 37, 39, 40, 42 of the MISFET device. More specifically, the lead 45 electrically connects the runner silicide 42 on the right-hand side of FIG. 1L to the source silicide 39. The contact 46 can be used to form an electrical connection to a lead situated on an insulator layer at a higher level of the structure (not shown). The leads 45, 46, 47, 48 and runners can thus be used to transmit electric signals to and from the gate, source and drain terminals of the MISFET device. An insulator layer 49 composed of silicon oxide, for example, is formed over the conductive leads 45, 46, 47, 48 to electrically insulate and protect the conductive leads and contacts, and the MISFET device. At respective ends opposite those in contact with the silicide regions 37, 38, 40, 42, the leads 45, 46, 47, 48 are generally coupled to other electronic components, and/or power or signal sources.

FIG. 2 is a top plan view of the MISFET device of FIG. 1L with the insulator layer 49 removed for more clear illustration of the MISFET device. The views of FIGS. 1A–1L are taken along a cross-section denoted by the section lines 100—100' in FIG. 2. In FIG. 2, connections between the conductive lead or contacts 45, 46, 47, 48 and the silicide regions 37, 39, 40, 42 are denoted by crossed squares at which the insulator layer 44 is selectively etched or formed to allow electrical contact to be made to the silicide regions. Also noteworthy in FIG. 2 is the extension of the gate region 22 and its silicide layer 37 beyond the active region 50 that is selectively irradiated in FIGS. 1F and 1G. The extension of the ends of the gate region 22 and its overlying silicide layer 37 onto the field isolation layer 20 that is outside of the area selectively irradiated allows these relatively cool portions of the gate region to dissipate heat away from the gate region so that the fluence required to form silicide in the gate region corresponds more closely to that necessary to form silicides in the source and drain regions. As is well-known in this technology, the relatively large square pad at the ends of the gate region 32 and the right-side runner region 33 facilitate proper connection to the overlying contacts 47, 48. The left-side runner 33 is used to form a connection between an integrated device(s), and signal or power sources other than the integrated transistor of FIG. 2.

Figure 3:
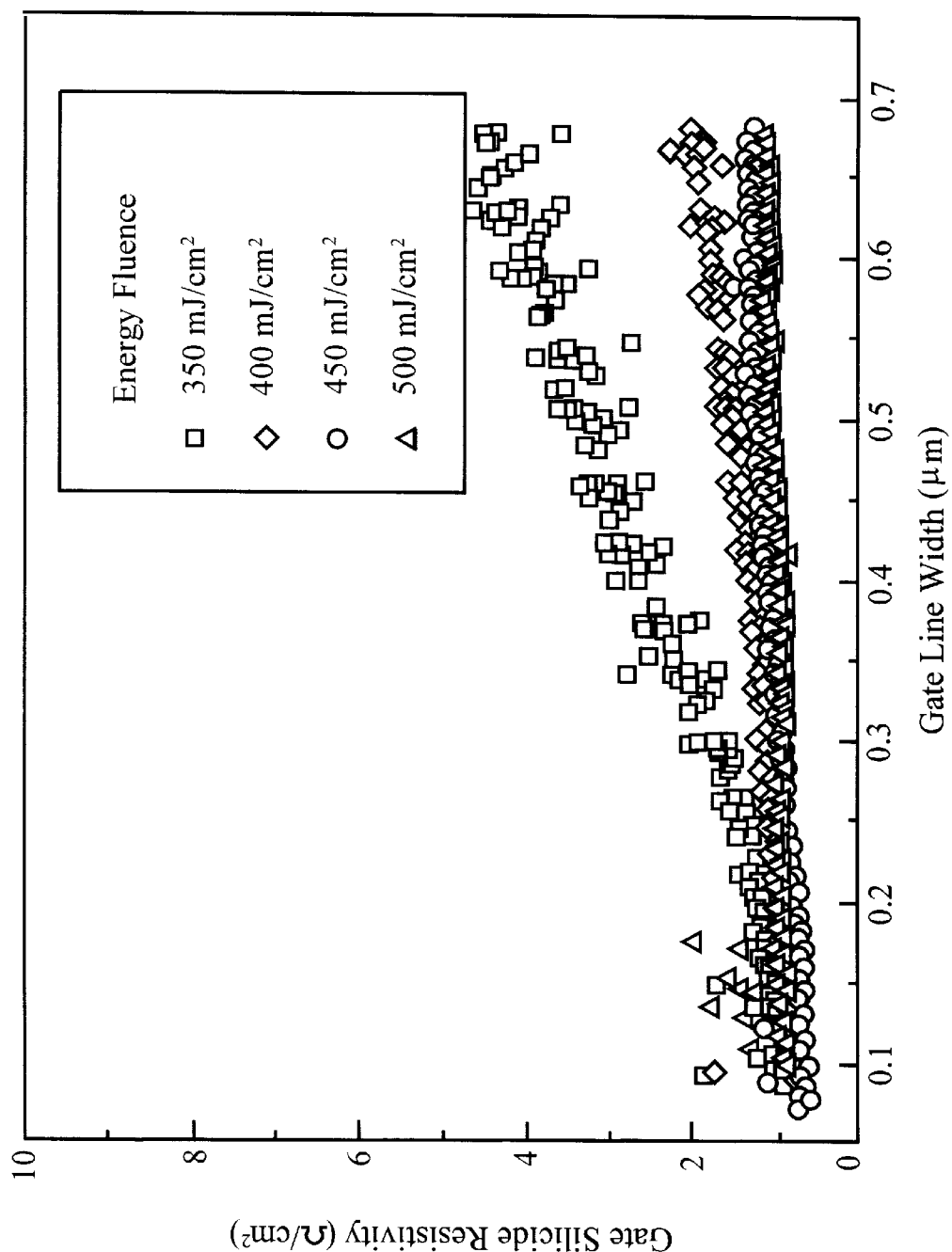
FIG. 3 is a graph of gate silicide resistivity versus line width for selected energy fluences.

FIG. 3 is a graph of gate resistivity versus line width for a titanium silicide gate region of an integrated MISFET device made using the invented method. As can be seen in FIG. 3, the value of the resistivity of the silicide gate region formed with a fluence of 0.35 $J/cm^2$ depends to a degree upon the lateral width of the gate. In contrast, at energy fluences of 0.40 and 0.45 $J/cm^2$, the resulting gate silicide resistivities are relatively constant and low, about 1 ohm per square centimeter, over a broad range of gate widths. Thus, in applications in which it is desired to produce titanium silicide with a relatively low and substantially gate-width-independent resistivity, the fluence for silicide formation should be maintained in a range from 0.3 to 0.5 $J/cm^2$.

The many features and advantages of the present invention are apparent from the detailed specification and thus, it is intended by the appended claims to cover all such features and advantages of the described method which follow in the true spirit and scope of the invention. Further, since numerous modifications and changes will readily occur to those of ordinary skill in the art, it is not desired to limit the invention to the exact construction and operation illustrated and described. Accordingly, all suitable modifications and equivalents may be resorted to as falling within the spirit and scope of the claimed invention.

What is claimed is:

1. A method comprising the steps of:
  a) producing amorphous regions on a gate, source, drain and connection runner for an integrated device formed on a silicon substrate;
  b) forming a metal layer in contact with the amorphous regions;
  c) selectively irradiating the metal layer with light to diffuse metal into at least the amorphous gate, source and drain regions to form respective alloy regions of silicide composition; and
  d) blanket irradiating the metal layer with light to diffuse metal into at least the connection runner to form an alloy region with a silicide composition.

2. A method as claimed in claim 1, further comprising the step of:

e) treating the alloy regions to convert the alloy regions into low-resistivity silicide regions.

3. A method as claimed in claim 2, wherein said step (e) is performed by rapid thermal annealing.

4. A method as claimed in claim 2, further comprising the step of:
   f) patterning an insulator layer and a conductive layer to form a conductive path that contacts at least one silicide region.

5. A method as claimed in claim 1, wherein said step (a) includes a substep of implanting ions into the source and drain regions of the silicon substrate and the gate and runner regions to form respective amorphous regions.

6. A method as claimed in claim 5, wherein the ions include at least one of silicon, argon, arsenic and germanium.

7. A method as claimed in claim 5, wherein the ions are implanted with an energy in a range from 2 to 100 kilo-electronVolts (keV).

8. A method as claimed in claim 5, wherein the substep of implanting is performed with a dosage in a range from $10^{13}$ to $10^{15}$ atoms per square centimeter.

9. A method as claimed in claim 5, further comprising the step of:
   e) selecting at least one of ion species, ion energy and ion dosage to determine the depth of the amorphous regions, said implanting substep performed based on said step (e).

10. A method as claimed in claim 1, further comprising the step of:
    e) stripping an oxide layer from the silicon substrate after performing said step (a) and before performing said step (b).

11. A method as claimed in claim 10, wherein said step (e) includes a substep of immersing the silicon substrate in an acidic bath.

12. A method as claimed in claim 1, wherein said step (b) includes a substep of sputtering metal onto the amorphous region to form the metal layer.

13. A method as claimed in claim 12, wherein the metal includes at least one of titanium, cobalt, and nickel.

14. A method as claimed in claim 1, wherein said step (b) includes a substep of evaporating metal onto the amorphous regions to form the metal layer.

15. A method as claimed in claim 1, wherein said step (b) includes a substep of forming the metal layer on the amorphous regions by chemical vapor deposition.

16. A method as claimed in claim 1, wherein the metal layer is formed with a thickness at least equal to the depth to which the amorphous regions are formed in the silicon substrate, divided by a consumption ratio of silicon to metal.

17. A method as claimed in claim 1, wherein the light fluence used in said step (c) is greater than the light fluence used in said step (d).

18. A method as claimed in claim 1, wherein the light fluence used in said step (c) is 0.1 to 0.5 Joules per square centimeter.

19. A method as claimed in claim 18, wherein the light fluence used in said step (d) is 0.1 to 0.35 Joules per square centimeter.

20. A method as claimed in claim 1, wherein the light fluence used in said step (d) is 0.1 to 0.35 Joules per square centimeter.

21. A method as claimed in claim 1, wherein the selective irradiation of said step (c) is performed with light of a fluence that is sufficiently large to render the source and drain amorphous regions and part of the gate region molten, yet insufficient to melt the substrate and metal layer, so that metal atoms diffuse from the metal layer into the molten regions of the gate, source and drain.

22. A method as claimed in claim 1, wherein the light used in the performance of the selective radiation of said step (c) has a fluence that is sufficient to consume the metal layer overlying the gate region so that the gate region is exposed, but that is sufficiently limited so that the increased reflectivity of the gate region relative to the metal layer reflects sufficient light energy upon exposure of the gate region to prevent substantial melting of the gate region beyond the silicide boundaries existing upon consumption of the overlying metal layer.

23. A method as claimed in claim 1, wherein a non-irradiated portion of the gate region extends outside of the substrate area selectively irradiated in said step (c) so that the non-irradiated portion is relatively cool and draws heat away from the irradiated portion of the gate region.

24. A method as claimed in claim 1, wherein the selective irradiation of said step (d) is performed with light of a fluence that is sufficiently large to render part of the runner region molten, yet insufficient to melt the substrate and metal layer, so that metal atoms diffuse from the metal layer into the runner.

25. A method as claimed in claim 1, wherein the light used in the irradiation of said step (d) has a fluence that is sufficient to consume the metal layer overlying the runner region so that the runner region is exposed, but that is sufficiently limited so that the increased reflectivity of the runner alloy region relative to the metal layer reflects sufficient light energy upon exposure of the runner alloy region after consumption of the overlying metal layer, to prevent further melting of the runner region.

26. A method as claimed in claim 1, wherein the light irradiation of said steps (c) and (d) is performed with laser light.

27. A method as claimed in claim 1, wherein the fluence of the light irradiation in each of said steps (c) and (d) is in a range from 0.1 to 1.0 Joules per square centimeter.

28. A method as claimed in claim 1, wherein the metal layer is irradiated by the light in a series of shots in said steps (c) and (d).

29. A method as claimed in claim 1, wherein the silicon substrate is situated in an ambient medium including at least one of argon, helium and nitrogen during performance of said steps (c) and (d).

30. A method as claimed in claim 1, wherein the gate alloy region is thicker than the source and drain alloy regions.

31. A method comprising the steps of:
   a) forming a gate, source and drain of an integrated device and at least one runner coupled to the integrated device, on a silicon substrate;
   b) amorphizing regions of the gate, source, drain and runner;
   c) forming a metal layer in contact with the amorphized regions;
   d) selectively irradiating the gate, source and drain regions with light of an energy fluence sufficient to melt part of the gate, and the amorphized source and drain regions, yet insufficient to melt the metal layer, silicon substrate and non-amorphized portions of the source and drain regions, so that metal diffuses into the gate, and amorphized source and drain regions to form respective alloy regions of silicide composition; and
   e) blanket irradiating the runner region with light of an energy fluence sufficient to melt part of the runner region, yet insufficient to melt the gate, source, and drain regions, the metal layer, and the silicon substrate.

32. A method as claimed in claim 31, wherein the irradiation of said step (d) is performed until the metal layer overlying the gate region is consumed so that the increased reflectivity of the gate alloy region relative to the metal layer prevents the gate region from further melting.

33. A method as claimed in claim 32, wherein the selective irradiation of said step (d) is continued after the consumption of the metal layer overlying the gate region to cause additional diffusion of metal from the metal layer into the source and drain regions.

34. A method as claimed in claim 31, wherein the gate region extends beyond the area selectively irradiated in said step (d) so that the relatively cool, non-irradiated portion of the gate region draws heat away from the irradiated portion of the gate region during the performance of said step (d).

35. A method as claimed in claim 31, further comprising the steps of:
   f) removing the unconsumed metal from the silicon substrate; and
   g) treating the alloy regions to convert the alloy regions into low-resistivity silicide regions.

36. A method as claimed in claim 35, wherein said step (g) includes a substep of rapid thermal annealing of the alloy regions to produce the low-resistivity silicide regions.

37. A method as claimed in claim 31, wherein said step (b) includes a substep of implanting ions into the silicon substrate to produce the amorphized regions.

38. A method as claimed in claim 31, wherein said step (c) includes a substep of sputtering the metal layer onto the amorphized regions.

39. A method as claimed in claim 31, wherein said step (c) includes a substep of evaporating the metal layer onto the amorphized regions.

40. A method as claimed in claim 31, wherein said step (c) includes a substep of forming the metal layer in contact with the amorphized regions using chemical vapor deposition.

41. A method as claimed in claim 31, wherein said step (d) includes a substep of irradiating the metal layer with laser light having a fluence in a range from 0.1 to 1.0 Joules per square centimeter.

42. A method as claimed in claim 31, wherein the irradiation is performed in said step (d) in a series of shots.

43. A method as claimed in claim 31, wherein the irradiation of said step (d) is performed with 3 to 10 shots of 10 to 100 nanoseconds in duration.

44. A method as claimed in claim 31, wherein said step (e) includes a substep of irradiating the metal layer with laser light having a fluence in a range from 0.1 to 1.0 Joules per square centimeter.

45. A method as claimed in claim 31, wherein the irradiation in said step (e) is performed in a series of shots.

46. A method as claimed in claim 31, wherein the irradiation in said step (e) is performed with 3 to 10 shots of 10 to 100 nanoseconds in duration.

47. A method as claimed in claim 31, wherein the fluence of the light used in the performance of said step (d) is greater than the fluence of the light used in the performance of said step (e).

48. A method as claimed in claim 47, wherein the fluence of the light used in the performance of said step (d) is in a range from 0.1 to 0.5 Joules per square centimeter, and wherein the fluence of light used in the performance of said step (e) is in a range from 0.1 to 0.35 Joules per square centimeter.

49. A method as claimed in claim 31, further comprising the step of:
   f) aligning a mask for use in the selective irradiation of the gate, source and drain amorphous regions in said step (d).

50. A method as claimed in claim 31, wherein the gate and runner alloy regions are thicker than the source and drain alloy regions.

* * * * *